(12) United States Patent
Chen et al.

(10) Patent No.: US 10,622,951 B1
(45) Date of Patent: Apr. 14, 2020

(54) DIGITAL COMMUNICATIONS CIRCUITS AND SYSTEMS

(71) Applicant: Xilinx, Inc., San Jose, CA (US)

(72) Inventors: Xiaohan Chen, Sunnyvale, CA (US); Christopher H. Dick, San Jose, CA (US); Hongzhi Zhao, Los Gatos, CA (US); Hemang M. Parekh, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/151,129

(22) Filed: Oct. 3, 2018

(51) Int. Cl.
*H03F 1/32* (2006.01)
*H03F 3/21* (2006.01)
*H04N 7/10* (2006.01)
*H04L 25/08* (2006.01)
*H04L 25/03* (2006.01)
*H04L 27/36* (2006.01)
*H04N 7/173* (2011.01)

(52) U.S. Cl.
CPC ............ *H03F 1/3247* (2013.01); *H03F 3/21* (2013.01); *H04L 25/03343* (2013.01); *H04L 25/08* (2013.01); *H04L 27/367* (2013.01); *H04N 7/102* (2013.01); *H04N 7/17309* (2013.01); *H03F 2201/3231* (2013.01)

(58) Field of Classification Search
CPC ............... H03F 1/3247; H03F 1/3241; H03F 2201/3233; H03F 2201/3224; H04B 2001/0425; H04B 10/2507; H04B 10/2575; H04L 27/367; H04L 27/368
USPC .......................................................... 375/297
See application file for complete search history.

(56) References Cited

U.S. PATENT DOCUMENTS

| 7,929,917 B1 * | 4/2011 | Morris ................. | H04B 17/14 375/141 |
| 8,666,336 B1 * | 3/2014 | Dick ..................... | H04B 17/11 375/296 |

(Continued)

OTHER PUBLICATIONS

Mekechuk, Kelly et al. "Linearizing Power Amplifiers Using Digital Predistortion, EDA Tools and Test Hardware," High Frequency Electronics, Apr. 2004, pp. 1-7.

(Continued)

*Primary Examiner* — Amritbir K Sandhu
(74) *Attorney, Agent, or Firm* — Patterson + Sheridan, LLP

(57) ABSTRACT

Described examples provide for digital communication circuits and systems that implement digital pre-distortion (DPD). In an example, a circuit includes a baseband DPD circuit, up-conversion circuitry, and feedback circuitry. The baseband DPD circuit comprises a baseband signal path and pre-distortion path. The pre-distortion path is configured to generate a pre-distortion signal based on the baseband signal. The baseband DPD circuit includes a first adder configured to add the baseband signal from the baseband signal path and the pre-distortion signal from the pre-distortion path to generate a pre-distorted baseband signal. The up-conversion circuitry is configured to convert the pre-distorted baseband signal to a radio frequency signal. The up-conversion circuitry is configured to be coupled to an input of a cable television (CATV) amplifier. The feedback circuitry comprises a DPD engine configured to determine a configuration of the pre-distortion path based on an output signal on the output of the CATV amplifier.

21 Claims, 7 Drawing Sheets

(56) References Cited

U.S. PATENT DOCUMENTS

| | | | |
|---|---|---|---|
| 8,837,633 B2 | 9/2014 | Dick | |
| 9,014,241 B2 | 4/2015 | Dick | |
| 9,189,458 B1* | 11/2015 | Langer | G06F 17/16 |
| 9,313,077 B2* | 4/2016 | Morris | H04L 27/368 |
| 9,337,886 B1* | 5/2016 | Dick | H04B 1/0475 |
| 9,338,039 B1 | 5/2016 | Barnes | |
| 9,866,269 B1* | 1/2018 | Zhao | H04L 25/03847 |
| 2004/0264597 A1* | 12/2004 | Vella-Coleiro | H03F 1/3294 |
| | | | 375/297 |
| 2005/0085198 A1* | 4/2005 | Anvari | H03F 1/3241 |
| | | | 455/114.3 |
| 2007/0153884 A1* | 7/2007 | Balasubramanian | |
| | | | H03F 1/3247 |
| | | | 375/221 |
| 2010/0220810 A1* | 9/2010 | Jin | H04L 27/368 |
| | | | 375/296 |
| 2011/0064171 A1* | 3/2011 | Huang | H03F 1/3247 |
| | | | 375/346 |
| 2013/0101066 A1* | 4/2013 | Dick | H04L 27/368 |
| | | | 375/296 |
| 2015/0236730 A1* | 8/2015 | Zhao | H04B 1/0475 |
| | | | 375/296 |
| 2016/0227549 A1* | 8/2016 | Shako | H04W 52/0261 |
| 2017/0005627 A1* | 1/2017 | Zhao | H03F 1/3252 |
| 2017/0033809 A1* | 2/2017 | Liu | H04B 1/04 |
| 2018/0183387 A1* | 6/2018 | Schemmann | H03F 1/0205 |

OTHER PUBLICATIONS

Ghannouchi, Fadhel M. et al., "Behavioral Modeling and Predistortion of Wideband Wireless Transmitters," May 2015, pp. 120-121, John Wiley & Sons Ltd.

Specification and drawings for U.S. Appl. No. 16/142,295, filed Sep. 26, 2018, Dick et al.

Specification and drawings for U.S. Appl. No. 16/142,893, filed Sep. 26, 2018, Dick et al.

* cited by examiner

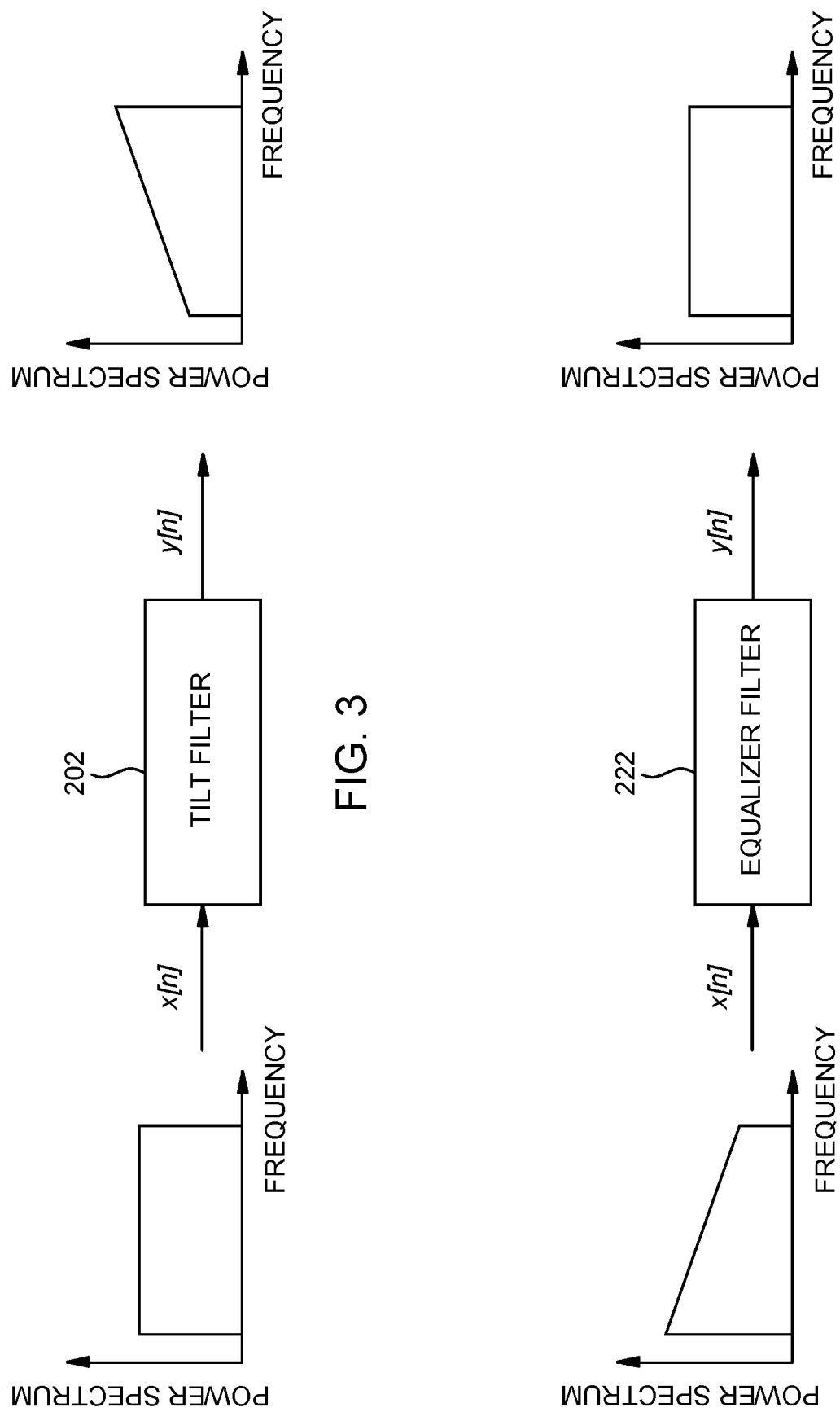

DIGITAL COMMUNICATIONS CIRCUITS AND SYSTEMS

TECHNICAL FIELD

Examples of the present disclosure generally relate to digital communication circuits and systems and, in particular, to digital communication circuits implementing digital pre-distortion (DPD) processing and systems including such circuits.

BACKGROUND

Power amplifiers are generally used in communication systems, such as wireless communication systems, to provide a desired gain to a signal that is being transmitted. Further, power amplifiers can provide a mechanism for load matching of the medium on which a signal is to be transmitted. However, amplifiers used in communication systems can cause challenges. Linearity of output responses of an amplifier may be relatively limited. Digital pre-distortion (DPD) can be used to enhance linearity of output response of a power amplifier.

SUMMARY

Examples described herein provide for digital communication circuits and systems that implement digital pre-distortion (DPD). The DPD can be implemented in a low frequency domain which can permit hardware costs savings, for example.

An example of the present disclosure is a circuit. The circuit includes a baseband digital pre-distortion circuit, up-conversion circuitry, a cable television (CATV) amplifier, and feedback circuitry. The baseband digital pre-distortion circuit comprises a baseband signal path and a pre-distortion path. The baseband signal path is configured to pass a baseband signal received by the baseband digital pre-distortion circuit. The pre-distortion path is configured to generate a pre-distortion signal based on the baseband signal. The baseband digital pre-distortion circuit includes a first adder configured to add the baseband signal from the baseband signal path and the pre-distortion signal from the pre-distortion path to generate a pre-distorted baseband signal. The up-conversion circuitry is coupled to the baseband digital pre-distortion circuit and is configured to convert the pre-distorted baseband signal to a radio frequency signal. The up-conversion circuitry is configured to be coupled to an input of a cable television (CATV) amplifier. The feedback circuitry is configured to be coupled to an output of the CATV amplifier. The feedback circuitry comprises a digital pre-distortion engine configured to determine a configuration of the pre-distortion path based on an output signal on the output of the CATV amplifier.

Another example of the present disclosure is a method for transmitting a signal. A pre-distortion signal is generated by a baseband digital pre-distortion circuit based on a baseband signal received by the baseband digital pre-distortion circuit. The pre-distortion signal and the baseband signal are added by the baseband digital pre-distortion circuit to generate a pre-distorted baseband signal. The pre-distorted baseband signal is up-converted by up-conversion circuitry to a radio frequency signal. The radio frequency signal is output, by the up-conversion circuitry, towards a CATV amplifier.

A further example of the present disclosure is a circuit. The circuit includes a baseband digital pre-distortion circuit, up-conversion circuitry coupled to the baseband digital pre-distortion circuit, and a CATV amplifier coupled to the up-conversion circuitry. The baseband digital pre-distortion circuit includes a first pre-distortion module, a phase rotator, a mixer, a second pre-distortion module, a first adder, and a second adder. The first pre-distortion module is configured to generate an intermediate pre-distortion signal based on a baseband signal input to the baseband digital pre-distortion circuit. The phase rotator is configured to phase rotate the intermediate pre-distortion signal. The mixer is configured to mix the phase rotated intermediate pre-distortion signal based on a radio frequency carrier frequency to generate a negative radio frequency carrier shifted video bandwidth pre-distortion signal. The second pre-distortion module is configured to generate a baseband pre-distortion signal based on the baseband signal. The first adder is configured to add the negative radio frequency carrier shifted video bandwidth pre-distortion signal and the baseband pre-distortion signal to generate an added signal. The second adder is configured to add the baseband signal and a signal based on the added signal to generate a pre-distorted baseband signal. The up-conversion circuitry is configured to convert the pre-distorted baseband signal to a radio frequency signal based on the radio frequency carrier frequency. The up-conversion circuitry is configured to be coupled to a cable television (CATV) amplifier.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 3 is a tilt filter with illustrative power spectrums of input signals and output signals according to an example.

FIG. 4 is an equalizer filter with illustrative power spectrums of input signals and output signals according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
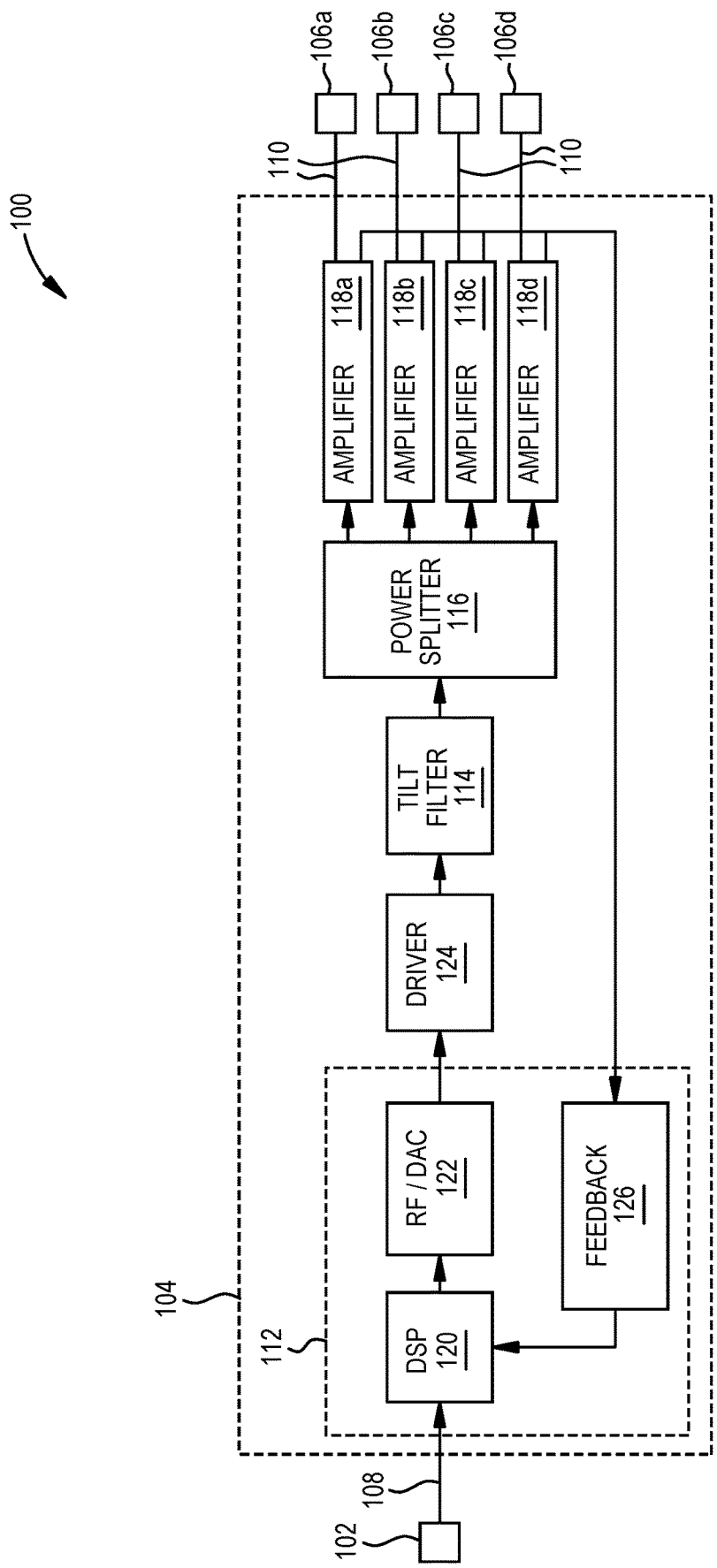
FIG. 1 is a block diagram of a portion of a digital communications network according to an example.

Examples described herein provide for digital communication circuits and systems that implement digital predistortion (DPD). In examples described herein, DPD can be more efficiently implemented in a circuit that processes a signal that is at a frequency lower than the radio frequency (RF) carrier frequency at which the signal is to be transmitted. For example, a baseband (BB) signal is processed to include DPD and is subsequently up-converted to a RF signal. In other examples, an intermediate frequency (IF) signal is processed to include DPD. By implementing the DPD in a lower frequency domain (e.g., compared to an RF domain), hardware costs of the circuit can be reduced.

Generally, DPD processing is implemented to compensate for a non-linear response of an amplifier used in a communications network. DPD can pre-distort a signal to be transmitted to effectively extend a linear response of the amplifier. Further, DPD can be implemented to reduce direct current (DC) power consumption of the amplifier.

More specifically, in a cable television (CATV) network, DPD can enable a CATV amplifier at a remote physical interface (PHY) to increase the efficiency of the CATV amplifier and reduce DC power consumption of the CATV amplifier. Some examples described herein implement interpolation and decimation, tilt and equalization filters, and a DPD function in a DPD data path, which may be implemented in programmable logic of a field programmable gate array (FPGA). The DPD data path may be implemented in a frequency domain that is lower than an RF frequency, such as at a BB frequency domain or IF frequency domain.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Even further, various descriptors are used below in the context of the described examples, such as BB signal. It is to be understood that such descriptors are for clarity of description and may not necessarily be appropriate for other examples, such as when processing is performed on an IF signal.

FIG. 1 is a block diagram of a portion of a digital communications network 100 according to an example. In some examples, the digital communications network 100 is a CATV network that implements, for example, Data Over Cable Service Interface Specification (DOCSIS) 3.1. The network 100 includes headend equipment 102, distribution equipment 104, and end user equipment 106a, 106b, 106c, and 106d. The headend equipment 102 is communicatively coupled to the distribution equipment 104, such as via an optical link 108 (e.g., optical fiber). The distribution equipment 104 is further communicatively coupled to the end user equipment 106a-d, such as via respective coaxial cables 110. The distribution equipment 104 is communicatively coupled between the headend equipment 102 and each of the end user equipment 106a-d. The distribution equipment 104 can be remote from each of the headend equipment 102 and the end user equipment 106a-d, or can be local to any one of the headend equipment 102 and the end user equipment 106a-d.

The distribution equipment 104 includes processing and driver circuitry 112, an analog tilt filter 114, a power splitter 116, and amplifiers 118a, 118b, 118c, and 118d. The processing and driver circuitry 112 includes a digital signal processor (DSP) 120, RF up-conversion and digital-to-analog converter (RF/DAC) circuit 122, a driver 124, and feedback circuit 126. Each of the driver 124 and amplifiers 118a-d can be a CATV amplifier.

Generally, a BB digital signal is transmitted from the headend equipment 102 via the optical link 108 and is received by the distribution equipment 104. The BB digital signal is input to the DSP 120 of the processing and driver circuitry 112. As will be described in more detail below, the BB digital signal is processed to compensate (e.g., by pre-distorting the signal) for a non-linear response that may be created in an output signal by subsequent circuitry. The pre-distorted BB digital signal is output from the DSP 120 and input to the RF/DAC circuit 122, which mixes the pre-distorted BB digital signal to a RF signal, which is converted to an analog RF signal. The analog RF signal is output from the RF/DAC circuit 122 and is input to the driver 124. The driver 124 can amplify the analog RF signal and output the amplified RF signal to the analog tilt filter 114. The analog tilt filter 114 generally attenuates signals within a bandwidth, where lower frequency signals within the bandwidth are attenuated more than higher frequency signals within the bandwidth. In some examples, a signal transmitted via a coaxial cable 110 experiences greater losses at higher frequencies than at lower frequencies. Hence, the analog tilt filter 114 can compensate for these losses in a coaxial cable 110 such that a signal received by an end user has a substantially consistent power spectrum across the bandwidth. The analog tilt filter 114 outputs the tilted RF output signal, which is input to the power splitter 116. In the illustration of FIG. 1, the power splitter 116 is a 1×4 power splitter, although other power splitters with varying number of ports may be implemented. The power splitter 116 transmits the tilted RF output signal to each of the amplifiers 118a-d. The amplifiers 118a-d can amplify the tilted RF output signal and can provide, e.g., a 75Ω impedance output. Each of the amplifiers 118a-d output an amplified, tilted RF output signal to a respective coaxial cable 110, which transmits the RF signal to a respective one of the end user equipment 106a-d. A portion of the RF output signals output from the CATV amplifiers 118a-d is coupled into the input of the feedback circuit 126 that can process the RF output signal to determine information that is then used in the DSP 120 for processing the BB digital signal.

Figure 2:
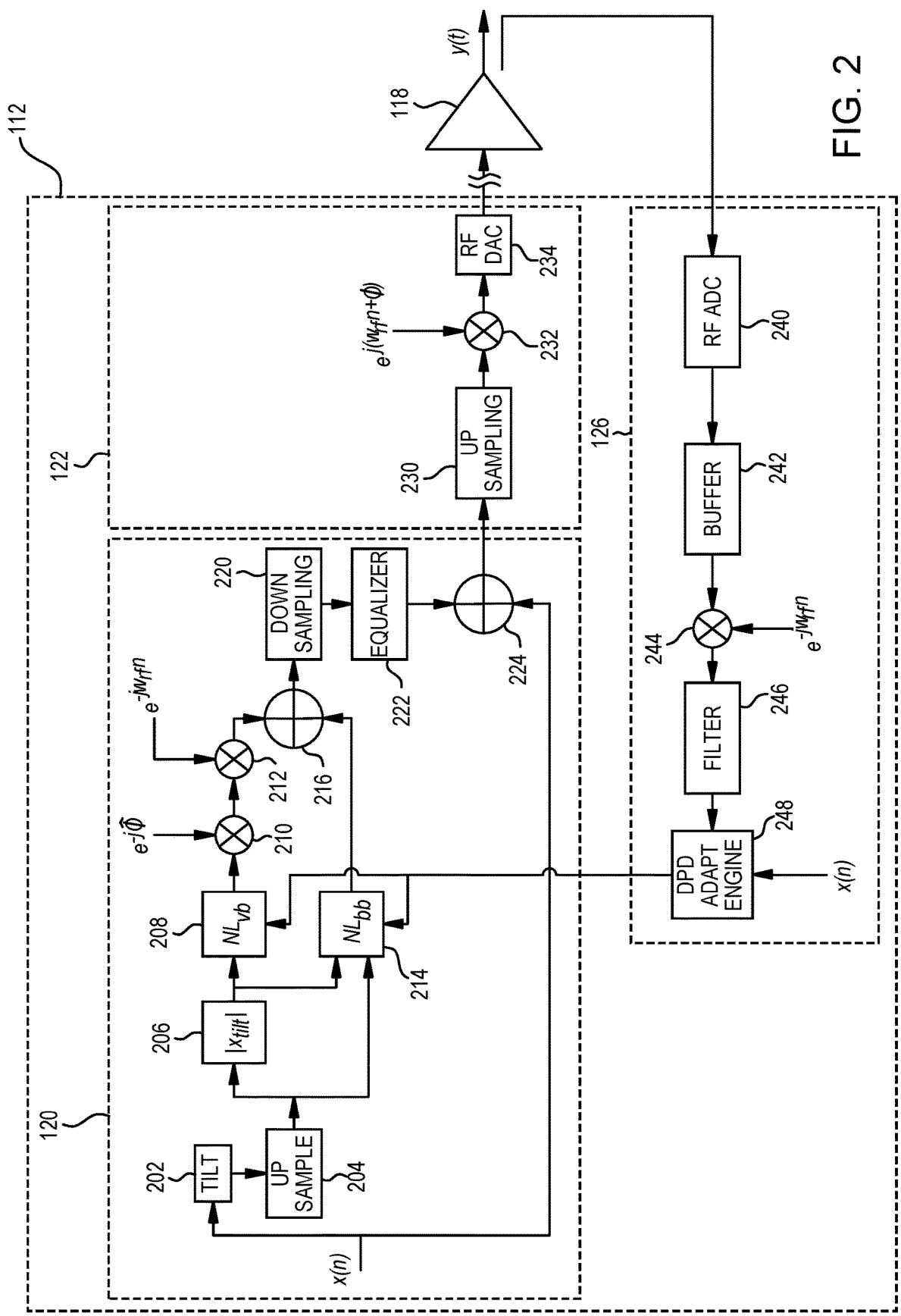
FIG. 2 is a schematic diagram of a portion of the processing and driver circuitry coupled to a cable television (CATV) amplifier of FIG. 1 according to an example.

FIG. 2 is a schematic diagram of a portion of the processing and driver circuitry 112 coupled to a CATV amplifier 118 according to an example. The processing and driver circuitry 112 provides for digital pre-distortion (DPD) processing of a BB digital signal that is to be up-converted to an RF signal and transmitted (e.g., via a coaxial cable). The DPD processing compensates for non-linearities that may be created in the RF output signal by the CATV amplifier 118. In some examples, the spectrum of the RF output signal spans from 108 MHz to 1218 MHz.

The DSP 120 includes a pre-distortion path and a BB signal path. The pre-distortion path includes a digital tilt filter 202, an up-sampling module 204, a magnitude module 206, a video bandwidth (VB) pre-distortion path, a BB pre-distortion path, an adder 216, a down-sampling module 220, and an equalizer filter 222. The VB pre-distortion path includes a VB non-linearity compensator module 208, a phase rotator 210, and a mixer 212. The BB pre-distortion path includes a BB non-linearity compensator module 214. The DSP 120 further includes an adder 224. The RF/DAC circuit 122 includes an up-sampling module 230, a mixer 232, and an RF-class DAC circuit 234. The feedback circuit 126 includes an RF-class analog-to-digital converter (ADC) circuit 240, a buffer 242, a mixer 244, a filter 246, and a DPD adapt engine 248. Each of the mixers 212, 232, and 244 can be a numerically controlled oscillator (NCO), for example.

A digital BB signal x(n) is input into the DSP 120. The BB signal x(n) is passed to the pre-distortion path and the BB signal path. In the pre-distortion path, the BB signal x(n) is input to the digital tilt filter 202. The digital tilt filter 202 replicates the effect of the analog tilt filter 114 of FIG. 1 on the BB signal x(n) and generates a tilted signal $x_{tilt}(n)$. The digital tilt filter 202 implements a filter function $h_T[n]$ that provides a higher gain at higher frequencies, as illustrated by the power spectrums as functions of frequency illustrated in FIG. 3. The filter function $h_T[n]$ of the digital tilt filter 202 can be generalized, based on an input signal $x[n]$ and output signal $y[n]$, as $$y[n] = \sum_{i=0}^{L} x[i]h_T[n-i].$$

Although implemented subsequently in the pre-distortion path, the equalizer filter 222 complements the digital tilt filter 202. The equalizer filter 222 implements a filter function $h_E[n]$ that provides a lower gain at higher frequencies to provide an equalized power spectrum, as illustrated by the power spectrums as functions of frequency illustrated in FIG. 4. The filter function $h_E[n]$ of the equalizer filter 222 can also be generalized, based on an input signal $x[n]$ and output signal $y[n]$, as $$y[n] = \sum_{i=0}^{L} x[i]h_E[n-i].$$

Inputting a signal sequentially through the digital tilt filter 202 and the equalizer filter 222 generates, generally, the same signal that was input initially. Using convolution, $h_T[n]*h_E[n]=1$.

Figure 5:
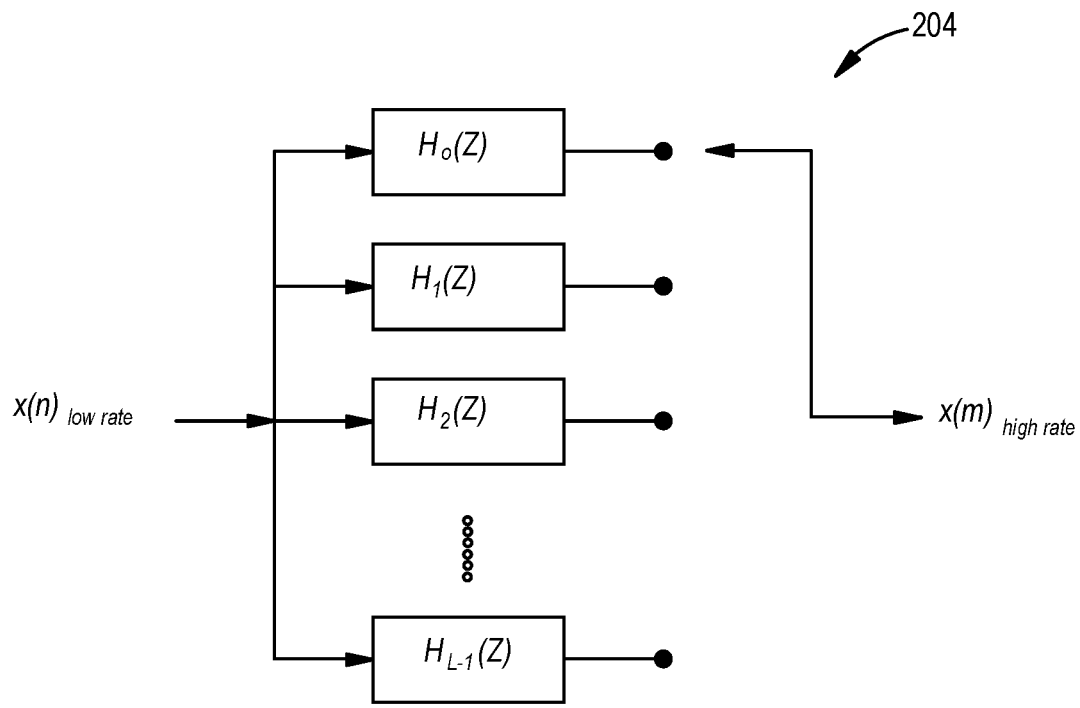
FIG. 5 is an up-sampling module according to an example.
Figure 6:
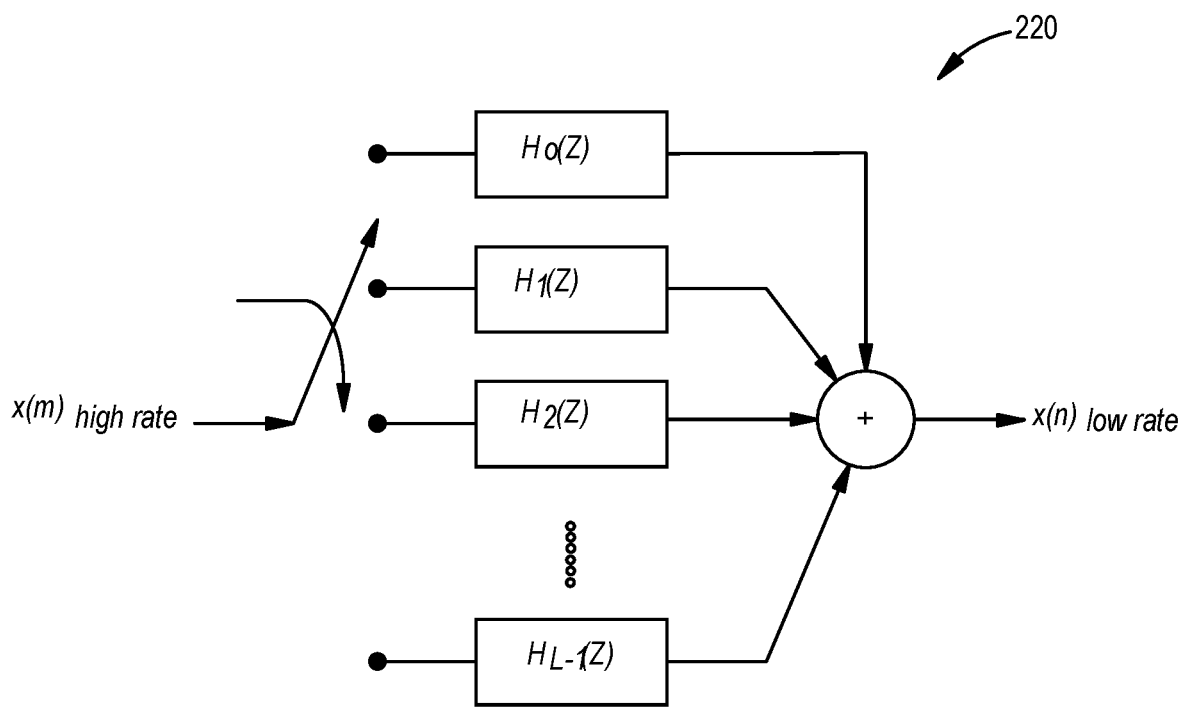
FIG. 6 is a down-sampling module according to an example.

The tilted signal $x_{tilt}(n)$ is input into the up-sampling module 204, which uses interpolation to increase the sampling rate of the tilted signal $x_{tilt}(n)$ and generate an up-sampled signal. In some examples, the sampling rate is increased by a factor of 2 (e.g., from 1638.4 MHz to 3276.8 MHz), although other examples can implement other increases in the sampling rate. FIG. 5 illustrates an example up-sampling module 204. The example up-sampling module 204 is a 1 to L interpolation filter that implements a polyphase interpolator structure. Each filter $H_i(Z)$ in FIG. 5 is a polyphase interpolation filter. Any output tap of a filter $H_i(Z)$ can be selected to selectively output a signal with an increased sampling rate. Although implemented subsequently in the pre-distortion path, the down-sampling module 220 complements the up-sampling module 204. FIG. 6 illustrates an example down-sampling module 220. The example down-sampling module 220 is a L to 1 decimation filter that implements a polyphase decimator structure. Each filter $H_i(Z)$ in FIG. 6 is a polyphase decimator filter. Any input tap of a filter $H_i(Z)$ can be selected to selectively output a signal with a decreased sampling rate. The outputs of the filters $H_i(Z)$ are coupled to an adder, but the outputs of each filter $H_i(Z)$ is zero except for the filter $H_i(Z)$ into which the input signal is input.

The up-sampled signal is input to the magnitude module 206 and the BB non-linearity compensator module 214. The magnitude module 206 determines a magnitude of the up-sampled signal and generates a magnitude signal $|x_{tilt}(n)|$. The magnitude module 206 can determine the magnitude signal $|x_{tilt}(n)|$ by determining the square root of the sum of the real part of the signal input to the magnitude module 206 squared and the imaginary part of the signal input to the magnitude module 206 squared (e.g., generally, $|x|=\sqrt{(Re\{x\})^2+(Im\{x\})^2}$). The magnitude signal $|x_{tilt}(n)|$ is input to the VB non-linearity compensator module 208 and the BB non-linearity compensator module 214.

In the VB pre-distortion path, the VB non-linearity compensator module 208 applies a first compensation function $NL_{vb}$ to the magnitude signal $|x_{tilt}(n)|$ to generate an intermediate pre-distortion signal, which is output from the VB non-linearity compensator module 208. The first compensation function $NL_{vb}$ can implement a Volterra series using coefficients determined by the DPD adapt engine 248, as described subsequently. The coefficients can be implemented in a look-up table (LUT), by a mapping function, or with another technique. As an example, the VB non-linearity compensator module 208 implements a non-linear model expressed as Expression (1):

$$NL_{vb} = \sum_{m=0}^{M} \sum_{k=1}^{K/2} D_{m,k} |x_{tilt}(n-m)|^{2k} \quad \text{Exp. (1)}$$

where m is memory, 2*k is the non-linear order, and $D_{m,k}$ is the coefficient (e.g., determined by the DPD adapt engine 248).

A negative phase rotation by a negative estimated phase offset $\hat{\phi}$ is applied to the intermediate pre-distortion signal by the phase rotator 210 to generate a phase rotated intermediate pre-distortion signal. The phase rotated intermediate pre-distortion signal is shifted by a negative RF carrier frequency $-w_{rf}$ by the mixer 212 to generate a frequency shifted VB pre-distortion signal. The VB pre-distortion signal is output by the mixer 212 to the adder 216.

In the BB pre-distortion path, the BB non-linearity compensator module 214 applies a second compensation function $NL_{bb}$ to the magnitude signal $|x_{tilt}(n)|$ to generate a BB pre-distortion signal, which is output from the BB non-linearity compensator module 214. The second compensation function $NL_{bb}$ can implement a Volterra series using coefficients determined by the DPD adapt engine 248, as described subsequently. The coefficients can be implemented in a LUT, by a mapping function, or with another technique. As an example, the BB non-linearity compensator module 214 implements a non-linear model expressed as Expression (2):

$$NL_{bb} = \sum_{m=0}^{M} \sum_{k=0}^{K-1} C_{m,k} x_{tilt}(n-m) |x_{tilt}(n-m)|^k \quad \text{Exp. (2)}$$

where m is memory, 2*k is the non-linear order, and $C_{m,k}$ is the coefficient (e.g., determined by the DPD adapt engine 248). The BB pre-distortion signal is output by the BB non-linearity compensator module 214 to the adder 216.

The VB pre-distortion signal and the BB pre-distortion signal are added together by the adder 216, and the resulting added signal is input to the down-sampling module 220. The down-sampling module 220 uses decimation to decrease the sampling rate of the added signal to generate a down-sampled signal, such as previously described. In some examples, the sampling rate is decreased by a factor of 2, although other examples can implement other decreases in the sampling rate. The down-sampled signal is input to the equalizer filter 222. The equalizer filter 222 can substantially equalize the power spectrum of a bandwidth, such that the effect of the digital tilt filter 202 can be removed, to generate the pre-distortion signal. The equalizer filter 222 was described previously in conjunction with the tilt filter 202. The pre-distortion signal is input to the adder 224, as is the BB signal x(n) from the BB signal path. The adder 224 adds the pre-distortion signal to the BB signal x(n) and outputs the resulting pre-distorted BB signal from the DSP 120.

The pre-distorted BB signal from the DSP 120 is up-sampled by the up-sampling module 230, such as by a factor of 2, 4, or another amount. The up-sampled signal is mixed by the mixer 232 with the RF carrier frequency $w_{rf}$ and phase offset ø to generate an RF signal. The RF signal is output from the mixer 232 and input to the RF-class DAC circuit 234, which converts the RF signal from a digital signal to an analog signal. The analog RF signal is passed through the analog transmit chain of the driver 124, the analog tilt filter 114, and the power splitter 116 to the CATV amplifier 118 (e.g., in FIG. 1). The CATV amplifier 118 amplifies the analog RF signal and outputs the amplified analog RF signal as the output signal y(t).

A CATV amplifier 118 may generate an output signal as a function of its input signal. In some examples, a CATV amplifier can have a linear region at lower input magnitude voltage where the output signal is a linear function of the input signal, and can have a non-linear region at higher input magnitude voltage where the output signal is not a linear function of the input signal. In some scenarios, as an example, the dominant non-linear terms are baseband (BB) non-linear terms (e.g., the non-linear components around the transmitted RF waveform) and video bandwidth (VB) non-linear terms (e.g., the non-linear components from DC to several 100 MHz caused by even harmonics) in a CATV amplifier with an analog tilt filter with attenuation up to 21 dB from 108 MHz to 1218 MHz. The VB non-linearity compensator module 208 and BB non-linearity compensator module 214, in conjunction with the feedback circuit 126 to be described subsequently, can effectively increase the region in which a linear response is output from the CATV amplifier 118.

The CATV amplifier output signal y(t) is feedback to the RF-class ADC circuit 240, which converts the analog output signal y(t) to a digital signal. The RF-class ADC circuit 240 can further convert the real signal y(t) to its corresponding complex signal. The RF-class ADC circuit 240 outputs the digital real signal, which is captured by the buffer 242. The captured signal is mixed with the negative RF carrier frequency $-w_{rf}$ by the mixer 244, and the mixed signal is filtered by the filter 246 to obtain a BB signal with non-linearities generated by the CATV amplifier 118. The filter 246 can be, e.g., a low pass filter, a band pass filter, or the like. The feedback BB signal with the non-linearities and the BB signal x(n) are input to the DPD adapt engine 248, which determines coefficients of the first and second compensation functions $NL_{vb}$ and $NL_{bb}$ of the VB non-linearity compensator module 208 and BB non-linearity compensator module 214, respectively, based on the signal input from the filter 246 and based on the BB signal x(n). In some examples, the DSP 120 and the RF/DAC circuit 122 are on two separate chips. In some examples, they are integrated on one chip. The mixer 232 inside the RF/DAC circuit 122 and the mixer 212 inside DSP 120 may not be phase synchronized, and hence, a phase offset φ may be between the mixer 212 and the mixer 232. The DPD adapt engine 248 determines the estimated phase offset 6.

In some examples, the first compensation function $NL_{vb}$ and second compensation function $NL_{bb}$ each implement a Volterra series, as described previously, and hence, the DPD adapt engine 248 implements an algorithm to generate the Volterra coefficients, such as a least square error (LSE) algorithm or the like. The DPD adapt engine 248 can determine the Volterra coefficients and store the coefficients in a LUT or with a mapping function that can be implemented by the VB non-linearity compensator module 208 and BB non-linearity compensator module 214.

The coefficients can be generated by one or more iterations of sampling the output signal y(t) using the feedback circuit 126. The coefficients can first be initialized such that the first compensation function $NL_{vb}$ and second compensation function $NL_{bb}$ each are zero (e.g., $NL_{vb}=0$ and $NL_{bb}=0$), and the estimated phase offset ø can be initialized to zero. With this initialization, the output signal y(t), as sampled and with the real signal obtained by the RF-class ADC circuit 240 as output signal y(n), can be modeled as indicated in Expression (3) below:

$$y(n) \rightarrow \text{Re}\{x(n)e^{j(w_{rf}n+\varphi)}+x(n)e^{j(w_{rf}n+\varphi)}F(|x(n)|^2)+H(|x(n)|^2)\} \quad \text{Exp. (3)}.$$

The terms $x(n)e^{j(w_{rf}n+\varphi)}F(|x(n)|^2)$ and $H(|x(n)|^2)$ are generated as a non-linear response by the CATV amplifier 118.

The DPD adapt engine 248 then estimates, in the first iteration, the first compensation function $NL_{vb}$ and second compensation function $NL_{bb}$ based on the estimated phase offset ø being initialized to zero. The first iteration results in the first compensation function $NL_{vb}$ and second compensation function $NL_{bb}$ indicated below in Expressions (4) and (5):

$$NL_{bb} \rightarrow -x(n)\hat{F}(|x(n)|^2) \quad \text{Exp. (4)},$$

$$NL_{vb}^1 \rightarrow -\hat{H}(|x(n)|^2) \quad \text{Exp. (5)}.$$

In a second iteration, with the estimated phase offset ø remaining initialized to zero and the first and second compensation functions $NL_{vb}$ and $NL_{bb}$ being as indicated in Expressions (4) and (5), the output signal y(t), as sampled and with the real signal obtained by the RF-class ADC circuit 240 as output signal y(n), can be modeled as indicated in Expression (6) below:

$$y(n) \rightarrow \text{Re}\{x(n)e^{j(w_{rf}n+\varphi)}-\hat{H}(|x(n)|^2)e^{j\varphi}+H(|x(n)|^2)\} \quad \text{Exp. (6)}.$$

The DPD adapt engine 248 then estimates, in the second iteration, the first compensation function $NL_{vb}$ based on the estimated phase offset ø being initialized to zero. The second iteration results in the first compensation function $NL_{vb}$ indicated below in Expression (7):

$$NL_{vb}^2 \rightarrow -\hat{H}(|x(n)|^2)+\hat{H}(|x(n)|^2)e^{j\varphi} \quad \text{Exp. (7)}.$$

With first compensation function $NL_{vb}$ resulting from the first and second iterations, the estimated phase offset ø can be determined. The estimated phase offset ø can be determined as indicated by Expression (8) below, where $NL_{vb}^1$ is the first compensation function $NL_{vb}$ resulting from the first iteration, $NL_{vb}^2$ is the first compensation function $NL_{vb}$ resulting from the second iteration, and $NL_{vb}^{1\prime}$ is the conjugate transpose of $NL_{vb}^1$:

$$e^{j\hat{\phi}} \approx \frac{NL_{vb}^{1\prime} * (NL_{vb}^1 - NL_{vb}^2)}{NL_{vb}^{1\prime} * NL_{vb}^1}. \quad \text{Exp. (8)}$$

With the estimated phase offset $\hat{\phi}$ determined, the phase rotator 210 can be programmed.

As an example, the DPD adapt engine 248 determines the coefficients $C_{m,k}$ and $D_{m,k}$ of the BB non-linearity compensator module 214 and VB non-linearity compensator module 208, respectively, described above. Inputs to the DPD adapt engine 248 include a time delay aligned BB data signal x(n) and BB feedback data $y_{bb}(n)$, where n=1 to N. The BB feedback data $y_{bb}(n)$ is the output signal y(t) from the CATV amplifier 118 that is gain adjusted and frequency shifted (e.g., by the mixer 244) and filtered (e.g., by the filter 246). The DPD adapt engine 248 obtains and keeps a copy of coefficients of the digital tilt filter 202. The DPD adapt engine 248 applies the transfer function of the digital tilt filter 202 to the time delay aligned BB data signal x(n) to obtain the spectrum tilted signal $x_{tilt}(n)$, where n=1 to N. N can be 1024, for example. The following Expression (9) is used to determine the coefficients $C_{m,k}$ and $D_{m,k}$ of the BB non-linearity compensator module 214 and VB non-linearity compensator module 208 using a LSE algorithm.

$$\sum_{m=0}^{M} \sum_{k=1}^{K/2} D_{m,k} |x_{tilt}(n-m)|^{2k} + \quad \text{Exp. (9)}$$

$$\sum_{m=0}^{M} \sum_{k=0}^{K-1} C_{m,k} x_{tilt}(n-m) * |x_{tilt}(n-m)|^k = y_{bb}(n).$$

The first and second compensation functions $NL_{vb}$ and $NL_{bb}$ are implemented in the VB non-linearity compensator module 208 and BB non-linearity compensator module 214, respectively, and the estimated phase offset $\hat{\phi}$ is implemented by the phase rotator 210. The first compensation function $NL_{vb}$ of the VB non-linearity compensator module 208 and the phase rotation with the estimated phase offset $\hat{\phi}$ are applied to the VB pre-distortion path, and the second compensation function $NL_{bb}$ of the BB non-linearity compensator module 214 is applied to the BB pre-distortion path. With these first and second compensation functions $NL_{vb}$ and $NL_{bb}$ and estimated phase offset $\hat{\phi}$ applied, the non-linearities caused by the CATV amplifier 118 can be compensated, and the linear response of the output signal y(t) can be extended.

The generation of the first and second compensation functions $NL_{vb}$ and $NL_{bb}$ can be by any number of iterations. Further, the first and second compensation functions $NL_{vb}$ and $NL_{bb}$ may be repeatedly and periodically generated to account for drift of the CATV amplifier 118, such as due to operating temperature, frequency, duration, etc.

Figure 7:
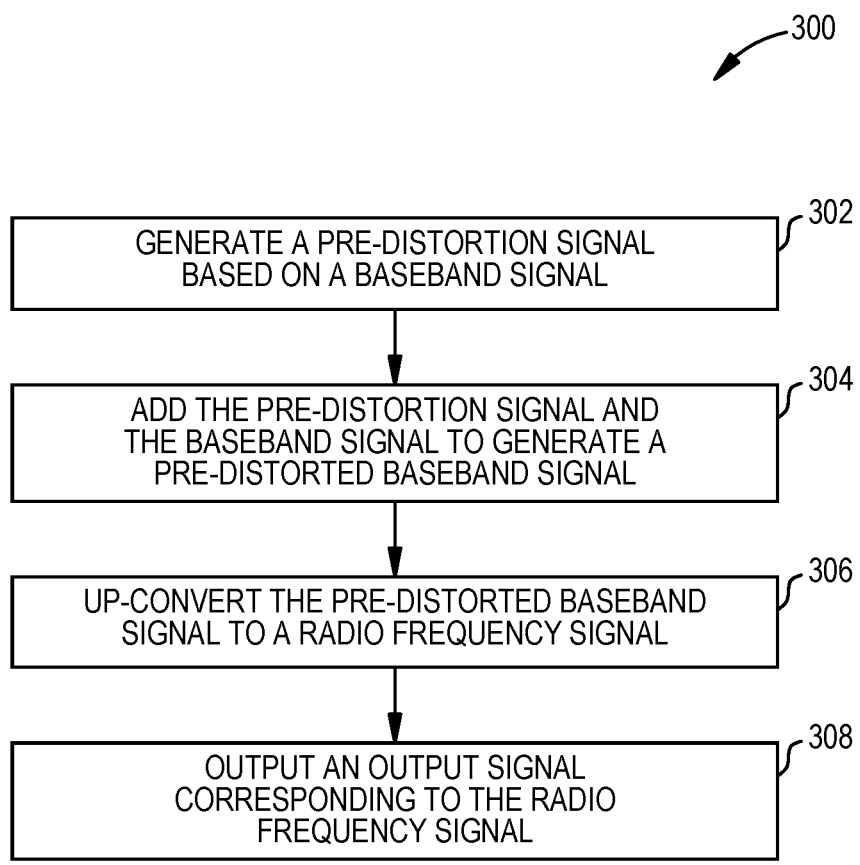
FIG. 7 is a method to process a signal to be transmitted by adding digital pre-distortion to the signal according to an example.

FIG. 7 is a method 300 to process a signal to be transmitted by adding digital pre-distortion to the signal according to an example. In operation 302, a pre-distortion signal is generated based on a BB signal. The pre-distortion signal can be generated as described above in the pre-distortion path of the DSP 120 as described above and described further below. In operation 304, the pre-distortion signal and the BB signal are added to generate a pre-distorted BB signal. The addition may be by the adder 224 described previously. In operation 306, the pre-distorted BB signal is up-converted to a RF signal, such as by the RF/DAC circuit 122 described previously. In operation 308, an output signal corresponding to the RF signal is output, such as by the CATV amplifier 118, via the driver 124, analog tilt filter 114, and power splitter 116, as described previously.

Figure 8:
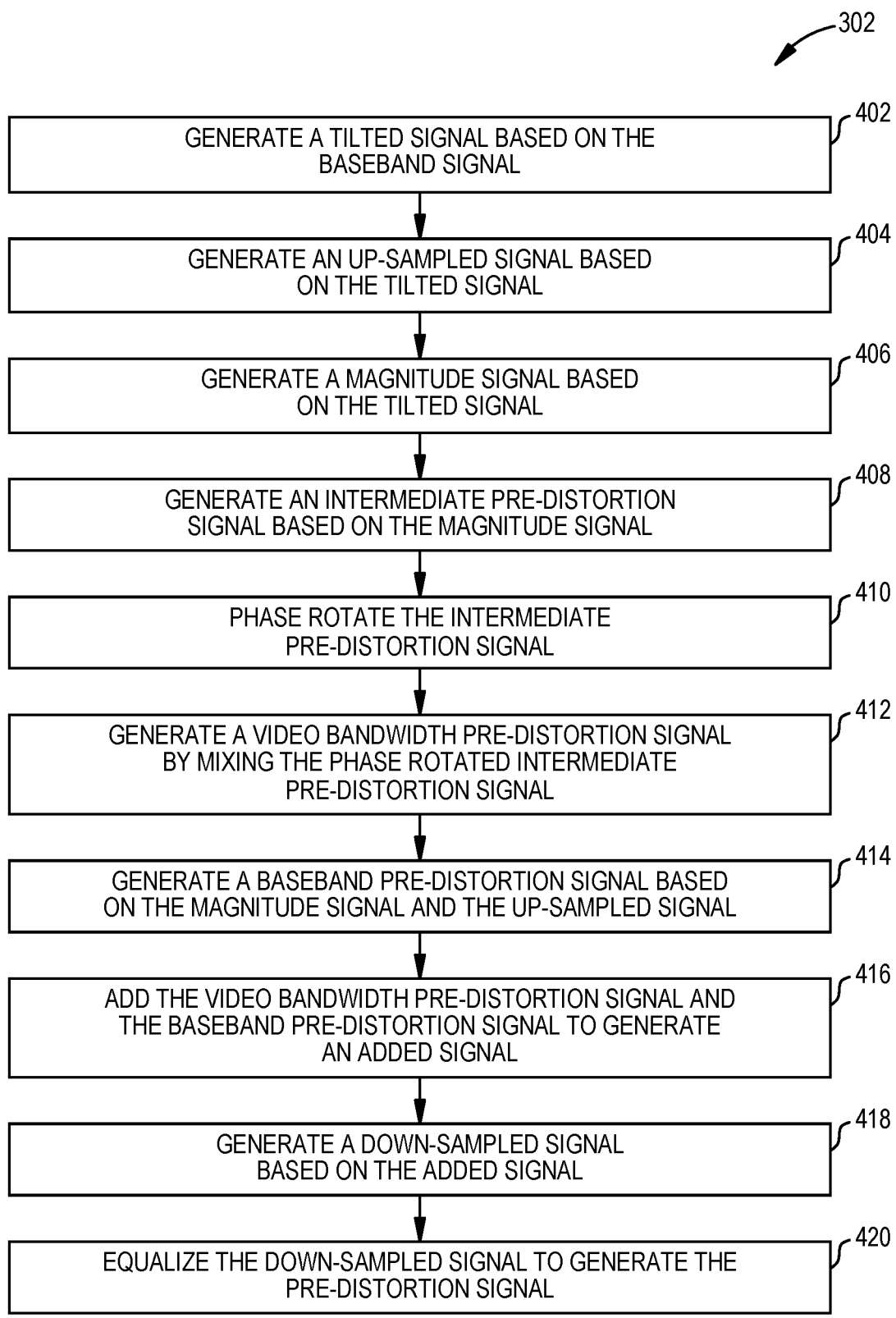
FIG. 8 is a method to generate a pre-distortion signal according to an example.

FIG. 8 is the operation 302 of FIG. 7 to generate a pre-distortion signal according to an example. In operation 402, a tilted signal is generated based on the BB signal, such as by the digital tilt filter 202 described previously. In operation 404, an up-sampled signal is generated based on the tilted signal, such as by the up-sampling module 204 described previously. In operation 406, a magnitude signal is generated based on the tilted signal, such as by the magnitude module 206 described previously. In operation 408, an intermediate pre-distortion signal is generated based on the magnitude signal, such as by the VB non-linearity compensator module 208 described previously. In operation 410, the intermediate pre-distortion signal is phase rotated to generate a phase rotated intermediate pre-distortion signal, such as by the phase rotator 210 described previously. In operation 412, a VB pre-distortion signal is generated by mixing the phase rotated intermediate pre-distortion signal using a negative RF carrier frequency, such as by the mixer 212 described previously. In operation 414, a BB pre-distortion signal is generated based on the magnitude signal and the up-sampled signal, such as by the BB non-linearity compensator module 214 described previously. In operation 416, the VB pre-distortion signal and the BB pre-distortion signal are added to generate an added signal, such as by the adder 216 described previously. In operation 418, a down-sampled signal is generated based on the added signal, such as by the down-sampling module 220 described previously. In operation 420, the down-sampled signal is equalized to generate the pre-distortion signal, such as by the equalizer filter 222 described previously.

Figure 9:
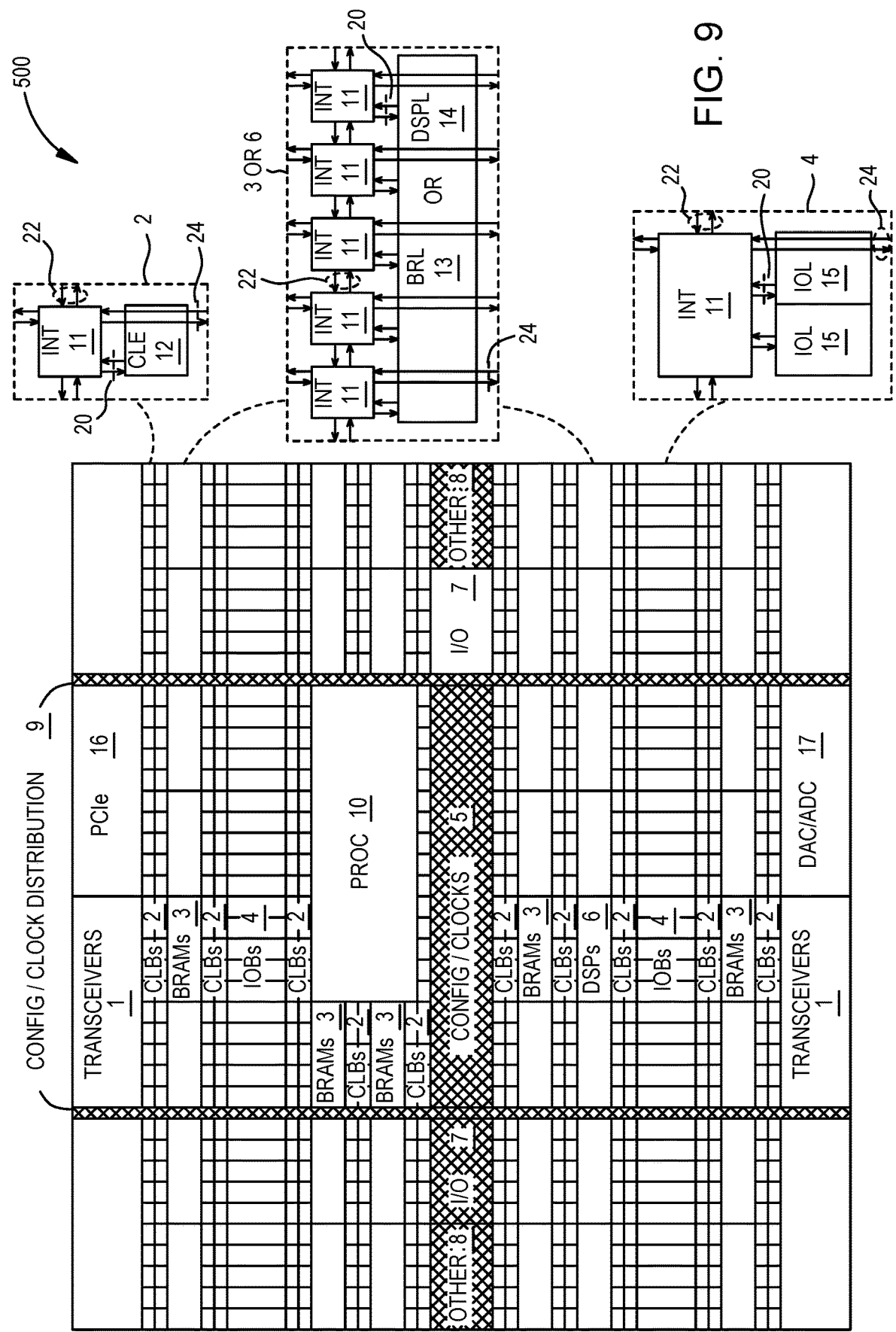
FIG. 9 illustrates an architecture of a field programmable gate array (FPGA) according to an example.

Various circuits and modules described above, such as the DSP 120, RF/DAC circuit 122, and/or feedback circuit 126, can be implemented within an integrated circuit, such as a FPGA (e.g., a RF System-on-Chip (SoC) FPGA) or like type programmable circuit. FIG. 9 illustrates an architecture of FPGA 500 that includes a large number of different programmable tiles including transceivers 1, configurable logic blocks (CLBs) 2, random access memory blocks (BRAMs) 3, input/output blocks (IOBs) 4, configuration and clocking logic (CONFIG/CLOCKS) 5, digital signal processing blocks (DSPs) 6, specialized input/output blocks (I/O) 7 (e.g., configuration ports and clock ports), and other programmable logic 8 such as digital clock managers, system monitoring logic, and so forth. Some FPGAs also include dedicated processor blocks (PROC) 10. The FPGA can also include PCIe interfaces 16, a DAC/ADC circuitry 17 (e.g., RF-class DAC and RF-class ADC), and the like.

In some FPGAs, each programmable tile can include at least one programmable interconnect element (INT) 11 having connections to input and output terminals 20 of a programmable logic element within the same tile, as shown by examples included in FIG. 9. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element (CLE) 12 that can be programmed to implement user logic plus a single programmable interconnect element (INT) 11. A BRAM 3 can include a BRAM logic element (BRL) 13 in addition to one or more programmable interconnect elements. Typically, the number of interconnect elements included in a tile depends on the height of the tile. In the illustrated example, a BRAM tile has the same height as five CLBs, but other numbers (e.g., four) can also be used. A DSP 6 can include a DSP logic element (DSPL) 14 in addition to an appropriate number of programmable interconnect elements. An IOB 4 can include, for example, two instances of an input/output logic element (IOL) 15 in addition to one instance of the programmable interconnect element 11. As will be clear to those of skill in the art, the actual I/O pads connected, for example, to the input/output logic element 15 typically are not confined to the area of the input/output logic element 15.

In the pictured example, a horizontal area near the center of the die is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 9 is intended to illustrate only an example FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Separation of the pre-distortion path and BB signal path can result in hardware cost savings design, which can permit low or no impact on the BB waveform quality (e.g., in modulation error ratio (MER) and/or bit error ratio (BER)). Further, a tilt filter and an equalizer filter can be implemented in low clock rate domain (1.6 GHz or less), which can save the number of multipliers significantly (such as by up to 50%) if a filter/equalizer is implemented in the form of poly-phase circuits. More savings can be achieved when the DPD rate is higher to cover higher order or wider signal bandwidth. An interpolation filter and/or decimation filter with fewer filter taps can be used due to both interpolation and decimation circuits are in the DPD data path. The DPD output signal can be 30 dB to 40 dB smaller than the baseband signal, and hence, the numerical resolution requirement can much lower than that of baseband signal. Additionally, the interface between the DPD block and RF/DAC circuitry is implemented in a low clock rate domain (1.6 GHz or less), which can save the power and resource for the interface connection.

While the foregoing is directed to specific examples, other and further examples may be devised without departing from the basic scope thereof, and the scope thereof is determined by the claims that follow.

What is claimed is:

1. A circuit comprising:
   a baseband digital pre-distortion circuit comprising a baseband signal path and a pre-distortion path, the baseband signal path being configured to pass a baseband signal received by the baseband digital pre-distortion circuit, the pre-distortion path being configured to generate a pre-distortion signal based on the baseband signal, the baseband digital pre-distortion circuit including a first adder configured to add the baseband signal from the baseband signal path and the pre-distortion signal from the pre-distortion path to generate a pre-distorted baseband signal;
   up-conversion circuitry coupled to the baseband digital pre-distortion circuit and configured to convert the pre-distorted baseband signal to a radio frequency signal, the up-conversion circuitry being configured to be coupled to an input of a cable television (CATV) amplifier; and
   feedback circuitry configured to be coupled to an output of the CATV amplifier, the feedback circuitry comprising a digital pre-distortion engine configured to determine a configuration of the pre-distortion path based on an output signal on the output of the CATV amplifier.

2. The circuit of claim 1, wherein:
   the pre-distortion path includes a video bandwidth pre-distortion path, a baseband pre-distortion path, and a second adder;
   the video bandwidth pre-distortion path includes a first pre-distortion module, a phase rotator, and a mixer, the first pre-distortion module being configured to generate an intermediate pre-distortion signal based on the baseband signal, the video bandwidth pre-distortion path being configured to phase rotate by the phase rotator and mix with the mixer the intermediate pre-distortion signal to generate a video bandwidth pre-distortion signal;
   the baseband pre-distortion path includes a second pre-distortion module, the second pre-distortion module being configured to generate a baseband pre-distortion signal; and
   the pre-distortion path further being configured to add by the second adder the video bandwidth pre-distortion signal and the baseband pre-distortion signal to generate an added signal, the pre-distortion signal being based on the added signal.

3. The circuit of claim 2, wherein:
   the pre-distortion path further includes a tilt filter, an up-sampling module, a magnitude module, a down-sampling module, and an equalizer filter; and
   the pre-distortion path is configured to:
      input the baseband signal to the tilt filter, the tilt filter being configured to generate and output a tilted signal;
      input the tilted signal to the up-sampling module, the up-sampling module being configured to increase a sampling rate of the tilted signal and output an up-sampled signal;

input the up-sampled signal to the magnitude module and the second pre-distortion module, the magnitude module being configured to generate a magnitude signal based on the up-sampled signal, the magnitude signal being input to the first pre-distortion module and the second pre-distortion module;

input the added signal to the down-sampling module, the down-sampling module being configured to decrease a sampling rate of the added signal and output a down-sampled signal; and input the down-sampled signal to the equalizer filter, the equalizer filter being configured to generate and output the pre-distortion signal.

4. The circuit of claim 1, wherein:

the pre-distortion path includes a tilt filter, an up-sampling module, a pre-distortion module, a down-sampling module, and an equalizer filter; and the pre-distortion path is configured to:

input the baseband signal to the tilt filter, the tilt filter being configured to generate and output a tilted signal;

input the tilted signal to the up-sampling module, the up-sampling module being configured to increase a sampling rate of the tilted signal and output an up-sampled signal;

input a first signal based on the up-sampled signal to the pre-distortion module, the pre-distortion module being configured to generate an intermediary pre-distortion signal based on the first signal and the configuration of the pre-distortion path configured by the digital pre-distortion engine;

input a second signal based on the intermediary pre-distortion signal to the down-sampling module, the down-sampling module being configured to decrease a sampling rate of the second signal and output a down-sampled signal; and input the down-sampled signal to the equalizer filter, the equalizer filter being configured to output the pre-distortion signal.

5. The circuit of claim 1, wherein the digital pre-distortion engine is configured to determine coefficients of a Volterra series, the coefficients of the Volterra series being implemented as the configuration of the pre-distortion path.

6. The circuit of claim 1 further comprising:
a driver coupled to the up-conversion circuitry;
a tilt filter coupled to the driver;
a power splitter coupled to the tilt filter; and
the CATV amplifier, the input of the CATV amplifier being coupled to the power splitter.

7. The circuit of claim 1, wherein the baseband digital pre-distortion circuit is implemented in programmable logic of a field programmable gate array (FPGA).

8. A method for transmitting a signal, the method comprising:

generating, by a baseband digital pre-distortion circuit, a pre-distortion signal based on a baseband signal received by the baseband digital pre-distortion circuit;

adding, by the baseband digital pre-distortion circuit, the pre-distortion signal and the baseband signal to generate a pre-distorted baseband signal;

up-converting, by up-conversion circuitry, the pre-distorted baseband signal to a radio frequency signal; and outputting, by the up-conversion circuitry, the radio frequency signal towards a cable television (CATV) amplifier.

9. The method of claim 8, wherein generating the pre-distortion signal comprises:

generating, by a first pre-distortion module, an intermediate pre-distortion signal based on the baseband signal;

phase rotating, by a phase rotator, the intermediate pre-distortion signal;

mixing, by a mixer, the phase rotated intermediate pre-distortion signal to generate a negative frequency shifted pre-distortion signal;

generating, by a second pre-distortion module, a baseband pre-distortion signal based on the baseband signal; and adding, by an adder, the negative frequency shifted pre-distortion signal and the baseband pre-distortion signal to generate an added signal, the pre-distortion signal being based on the added signal.

10. The method of claim 9, wherein generating the pre-distortion signal further comprises:

generating, by a tilt filter, a tilted signal based on the baseband signal;

up-sampling, by an up-sampling module, the tilted signal to generate an up-sampled signal;

generating, by a magnitude module, a magnitude signal based on the up-sampled signal, wherein the negative frequency shifted pre-distortion signal is based on the magnitude signal, and wherein the baseband pre-distortion signal is based on the up-sampled signal and the magnitude signal;

down-sampling, by a down-sampling module, the added signal to generate a down-sampled signal; and generating, by an equalizer filter, the pre-distortion signal based on the down-sampled signal.

11. The method of claim 9, wherein:

up-converting the pre-distorted baseband signal to the radio frequency signal includes mixing the pre-distorted baseband signal based on a radio frequency carrier frequency; and mixing the phase rotated intermediate pre-distortion signal to generate the negative frequency shifted pre-distortion signal includes mixing the phase rotated intermediate pre-distortion signal based on the radio frequency carrier frequency.

12. The method of claim 8, wherein generating the pre-distortion signal comprises:

generating, by a tilt filter, a tilted signal based on the baseband signal;

up-sampling, by an up-sampling module, the tilted signal to generate an up-sampled signal;

generating, by a pre-distortion module, an intermediate pre-distortion signal based on the up-sampled signal;

down-sampling, by a down-sampling module, a signal based on the intermediate pre-distortion signal to generate a down-sampled signal; and generating, by an equalizer filter, the pre-distortion signal based on the down-sampled signal.

13. The method of claim 8, wherein generating the pre-distortion signal is further based on coefficients of a Volterra series, the coefficients of the Volterra series being determined by a digital pre-distortion engine based on a sampled output signal of the CATV amplifier.

14. The method of claim 8 further comprising transmitting, via a coaxial cable, a transmitted signal based on the radio frequency signal.

15. The method of claim 8, wherein the baseband digital pre-distortion circuit is implemented in programmable logic of a field programmable gate array (FPGA).

16. A circuit comprising:
a baseband digital pre-distortion circuit comprising:
- a first pre-distortion module configured to generate an intermediate pre-distortion signal based on a baseband signal input to the baseband digital pre-distortion circuit;
- a phase rotator configured to phase rotate the intermediate pre-distortion signal;
- a mixer configured to mix the phase rotated intermediate pre-distortion signal based on a radio frequency carrier frequency to generate a negative radio frequency carrier shifted video bandwidth pre-distortion signal;
- a second pre-distortion module configured to generate a baseband pre-distortion signal based on the baseband signal;
- a first adder configured to add the negative radio frequency carrier shifted video bandwidth pre-distortion signal and the baseband pre-distortion signal to generate an added signal; and
- a second adder configured to add the baseband signal and a signal based on the added signal to generate a pre-distorted baseband signal; and up-conversion circuitry coupled to the baseband digital pre-distortion circuit and configured to convert the pre-distorted baseband signal to a radio frequency signal based on the radio frequency carrier frequency, the up-conversion circuitry being configured to be coupled to a cable television (CATV) amplifier.

17. The circuit of claim 16 further comprising feedback circuitry configured to be coupled to an output of the CATV amplifier, the CATV amplifier being configured to output an output signal, the feedback circuitry comprising a digital pre-distortion engine configured to determine a configuration of the first pre-distortion module based on the output signal and a configuration of the second pre-distortion module based on the output signal.

18. The circuit of claim 16, wherein the first pre-distortion module generates the intermediate pre-distortion signal based on a first set of coefficients of a Volterra series, and the second pre-distortion module generates the baseband pre-distortion signal based on a second set of coefficients of a Volterra series.

19. The circuit of claim 16, wherein the baseband digital pre-distortion circuit comprises:
- a tilt filter configured to generate a tilted signal based on the baseband signal;
- an up-sampling module configured to generate an up-sampled signal based on the tilted signal;
- a magnitude module configured to generate a magnitude signal based on the up-sampled signal, wherein the first pre-distortion module is configured to generate the intermediate pre-distortion signal based on the magnitude signal, and wherein the second pre-distortion module is configured to generate the baseband pre-distortion signal based on the up-sampled signal and the magnitude signal;
- a down-sampling module configured to generate a down-sampled signal based on the added signal; and
- an equalizer filter configured to generate an equalized signal based on the added signal, the equalized signal being the signal based on the added signal added by the second adder to generate the pre-distorted baseband signal.

20. The circuit of claim 16, wherein the baseband digital pre-distortion circuit is implemented in programmable logic of a field programmable gate array (FPGA).

21. The circuit of claim 1, wherein:
the pre-distortion path includes a tilt filter and an equalizer filter; and
the pre-distortion path is configured to:
- input the baseband signal to the tilt filter, the tilt filter being configured to generate and output a tilted signal;
- generate an intermediate pre-distortion signal based on the tilted signal, the intermediate pre-distortion signal further being based on the configuration of the pre-distortion path determined by the digital pre-distortion engine; and
- input the intermediate pre-distortion signal to the equalizer filter, the equalizer filter being configured to output the pre-distortion signal.

* * * * *

UNITED STATES PATENT AND TRADEMARK OFFICE
CERTIFICATE OF CORRECTION

PATENT NO. : 10,622,951 B1  
APPLICATION NO. : 16/151129  
DATED : April 14, 2020  
INVENTOR(S) : Xiaohan Chen Page 1 of 1

It is certified that error appears in the above-identified patent and that said Letters Patent is hereby corrected as shown below:

In the Specification

Column 8, Line 10, Delete "6." and insert -- $\hat{\varnothing}$. --, therefor.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*